United States Patent
Yasunaga

(10) Patent No.: US 9,484,282 B2
(45) Date of Patent: Nov. 1, 2016

(54) RESIN-SEALED SEMICONDUCTOR DEVICE

(75) Inventor: Shoji Yasunaga, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 12/256,680

(22) Filed: Oct. 23, 2008

(65) Prior Publication Data

US 2009/0184412 A1    Jul. 23, 2009

(30) Foreign Application Priority Data

Oct. 25, 2007   (JP) ................................. 2007-277269

(51) Int. Cl.
| | | |
|---|---|---|
| H01L 33/00 | (2010.01) | |
| H01L 23/433 | (2006.01) | |
| H01L 23/31 | (2006.01) | |
| H01L 25/10 | (2006.01) | |
| H01L 23/00 | (2006.01) | |

(52) U.S. Cl.
CPC ....... H01L 23/4334 (2013.01); H01L 23/3128 (2013.01); H01L 25/105 (2013.01); H01L 24/45 (2013.01); H01L 24/48 (2013.01); H01L 24/73 (2013.01); H01L 2224/32225 (2013.01); H01L 2224/45144 (2013.01); H01L 2224/48091 (2013.01); H01L 2224/48227 (2013.01); H01L 2224/73265 (2013.01); H01L 2225/1023 (2013.01); H01L 2225/1058 (2013.01); H01L 2924/01079 (2013.01); H01L 2924/14 (2013.01); H01L 2924/15311 (2013.01); H01L 2924/15331 (2013.01); H01L 2924/3511 (2013.01)

(58) Field of Classification Search
None
See application file for complete search history.

(56) References Cited

U.S. PATENT DOCUMENTS

| | | | | |
|---|---|---|---|---|
| 4,916,522 | A * | 4/1990 | Cohn ............................ | 257/687 |
| 4,965,227 | A * | 10/1990 | Chang et al. .................... | 29/827 |
| 5,065,281 | A * | 11/1991 | Hernandez et al. .......... | 361/709 |
| 5,102,829 | A * | 4/1992 | Cohn ............................. | 29/837 |
| 5,144,412 | A * | 9/1992 | Chang et al. ................. | 257/665 |
| 5,200,809 | A * | 4/1993 | Kwon ........................... | 257/707 |
| 5,229,643 | A * | 7/1993 | Ohta et al. .................... | 257/706 |
| 5,500,785 | A | 3/1996 | Funada | |
| 5,692,296 | A * | 12/1997 | Variot ............................. | 29/827 |
| 5,726,493 | A * | 3/1998 | Yamashita et al. ........... | 257/698 |
| 6,613,606 | B1 * | 9/2003 | Lee ................................ | 438/108 |
| 6,638,080 | B2 * | 10/2003 | Johnson et al. ................ | 439/77 |
| 6,967,125 | B2 * | 11/2005 | Fee et al. ...................... | 438/112 |
| 6,987,030 | B2 * | 1/2006 | Mita .............................. | 438/106 |
| 7,087,461 | B2 * | 8/2006 | Park et al. ..................... | 438/112 |

(Continued)

FOREIGN PATENT DOCUMENTS

| | | |
|---|---|---|
| JP | 6-225285 | 9/1994 |
| JP | 6-252285 | 9/1994 |

(Continued)

*Primary Examiner* — David E Graybill
(74) *Attorney, Agent, or Firm* — Fish & Richardson P.C.

(57) ABSTRACT

There is provided a resin-sealed semiconductor device (BGA type semiconductor device) whose heat dissipating characteristic is improved, so that it is prevented from deteriorating in reliability. This BGA type semiconductor device includes a wiring substrate on a predetermined area on which a semiconductor chip is mounted; a plurality of metal bumps that are formed to be arranged at predetermined intervals in an area of the substrate different from the area on which the semiconductor chip is mounted; and a sealing resin layer that covers at least the semiconductor chip. Each of the plurality of metal bumps is covered with the sealing resin layer described above, with a part thereof exposed at a top face of the sealing resin layer.

22 Claims, 4 Drawing Sheets

(56) References Cited

U.S. PATENT DOCUMENTS

| | | | |
|---|---|---|---|
| 7,187,068 B2* | 3/2007 | Suh et al. ............ | 257/685 |
| 7,517,778 B2* | 4/2009 | Lee et al. ............ | 438/584 |
| 7,556,983 B2* | 7/2009 | Kurita ............ | 438/108 |
| 7,564,137 B2* | 7/2009 | Lam ............ | 257/774 |
| 7,642,133 B2* | 1/2010 | Wu et al. ............ | 438/109 |
| 7,656,031 B2* | 2/2010 | Chen et al. ............ | 257/733 |
| 7,671,457 B1* | 3/2010 | Hiner et al. ............ | 257/678 |
| 7,737,565 B2* | 6/2010 | Coffy ............ | 257/787 |
| 7,777,351 B1* | 8/2010 | Berry et al. ............ | 257/778 |
| 7,791,203 B2* | 9/2010 | Boon et al. ............ | 257/773 |
| 7,791,206 B2* | 9/2010 | Takeuchi et al. ............ | 257/774 |
| 7,867,818 B2* | 1/2011 | Suh et al. ............ | 438/107 |
| 7,932,605 B2* | 4/2011 | Imoto et al. ............ | 257/774 |
| 7,960,212 B2* | 6/2011 | Lee et al. ............ | 438/110 |
| 7,960,827 B1* | 6/2011 | Miller et al. ............ | 257/712 |
| 8,018,068 B1* | 9/2011 | Scanlan et al. ............ | 257/774 |
| 8,026,587 B1* | 9/2011 | Hiner et al. ............ | 257/687 |
| 8,110,909 B1* | 2/2012 | Hiner et al. ............ | 257/686 |
| 8,124,446 B2* | 2/2012 | Lee et al. ............ | 438/106 |
| 8,222,538 B1* | 7/2012 | Yoshida et al. ............ | 174/262 |
| 8,299,595 B2* | 10/2012 | Yoon et al. ............ | 257/686 |
| 8,300,423 B1* | 10/2012 | Darveaux et al. ............ | 361/772 |
| 8,341,835 B1* | 1/2013 | Huemoeller et al. ............ | 29/841 |
| 8,471,154 B1* | 6/2013 | Yoshida et al. ............ | 174/260 |
| 8,482,134 B1* | 7/2013 | Darveaux et al. ............ | 257/780 |
| 8,536,462 B1* | 9/2013 | Darveaux et al. ............ | 174/260 |
| 8,618,659 B2* | 12/2013 | Sato et al. ............ | 257/737 |
| 8,623,753 B1* | 1/2014 | Yoshida et al. ............ | 438/613 |
| 8,772,152 B2* | 7/2014 | Co et al. ............ | 438/617 |
| 2001/0026010 A1* | 10/2001 | Horiuchi et al. ............ | 257/678 |
| 2002/0027290 A1 | 3/2002 | Sakamoto et al. | |
| 2002/0066952 A1 | 6/2002 | Taniguchi et al. | |
| 2002/0135057 A1* | 9/2002 | Kurita ............ | 257/685 |
| 2003/0003780 A1* | 1/2003 | Johnson et al. ............ | 439/67 |
| 2003/0011065 A1 | 1/2003 | Sakamoto et al. | |
| 2003/0042564 A1 | 3/2003 | Taniguchi et al. | |
| 2004/0038471 A1 | 2/2004 | Sakamoto et al. | |
| 2004/0219717 A1* | 11/2004 | Takahashi et al. ............ | 438/108 |
| 2004/0262728 A1* | 12/2004 | Sterrett et al. ............ | 257/678 |
| 2005/0045369 A1* | 3/2005 | Ishimaru et al. ............ | 174/250 |
| 2005/0121764 A1* | 6/2005 | Mallik et al. ............ | 257/686 |
| 2005/0206014 A1 | 9/2005 | Sakamoto et al. | |
| 2006/0022332 A1* | 2/2006 | Koyama et al. ............ | 257/723 |
| 2006/0043564 A1* | 3/2006 | Dimaano et al. ............ | 257/687 |
| 2006/0186517 A1* | 8/2006 | Jang ............ | 257/676 |
| 2006/0255475 A1* | 11/2006 | Boon ............ | 257/778 |
| 2006/0258052 A1* | 11/2006 | Boon ............ | 438/113 |
| 2006/0261475 A1* | 11/2006 | Boon ............ | 257/737 |
| 2006/0261493 A1* | 11/2006 | Boon ............ | 257/778 |
| 2007/0080437 A1* | 4/2007 | Marimuthu et al. ............ | 257/676 |
| 2007/0141751 A1 | 6/2007 | Mistry et al. | |
| 2007/0235859 A1* | 10/2007 | Espiritu et al. ............ | 257/706 |
| 2007/0252255 A1* | 11/2007 | Lam ............ | 257/678 |
| 2007/0262435 A1* | 11/2007 | Lam ............ | 257/686 |
| 2007/0290376 A1* | 12/2007 | Zhao et al. ............ | 257/787 |
| 2008/0061414 A1* | 3/2008 | Retuta et al. ............ | 257/676 |
| 2008/0169544 A1 | 7/2008 | Tanaka et al. | |
| 2009/0115050 A1 | 5/2009 | Kasuya et al. | |
| 2009/0184412 A1* | 7/2009 | Yasunaga ............ | 257/693 |
| 2011/0156226 A1 | 6/2011 | Kasuya et al. | |

FOREIGN PATENT DOCUMENTS

| | | | |
|---|---|---|---|
| JP | 6-310861 | 11/1994 | |
| JP | 11-026658 | 1/1999 | |
| JP | 2002-158315 | 5/2002 | |
| JP | 2002-170906 | 6/2002 | |
| JP | 2002170906 A * | 6/2002 | ............ H01L 23/12 |
| JP | 2003-8186 | 1/2003 | |
| JP | 2007-59486 | 3/2007 | |
| WO | 2007-083351 | 7/2007 | |
| WO | WO 2007083351 A1 * | 7/2007 | |

* cited by examiner

RESIN-SEALED SEMICONDUCTOR DEVICE

This application is based on Japanese Patent Application No. 2007-277269 filed on Oct. 25, 2007, the contents of which are hereby incorporated by reference.

BACKGROUND OF THE INVENTION

1. Field of the Invention

The present invention relates to a resin-sealed semiconductor device, and particularly relates to a resin-seal type semiconductor device having a substrate on which a semiconductor chip is mounted.

2. Description of Related Art

Along with the recent increase in power consumption and integration of semiconductor devices, semiconductor devices have come to generate more heat in operation. Since such increase in heat generated by semiconductor devices in operation causes problems such as a malfunction and a shorter lifetime of a semiconductor element, there has been strong demand for improvement in heat dissipating characteristic of semiconductor devices.

A conventionally known way of meeting such demand is use of a resin-seal type semiconductor device that is capable of efficiently dissipating heat generated therein. An example of such a resin-seal type semiconductor device is disclosed in JP-A-H11-26658.

JP-A-H11-26658 mentioned above discloses a BGA (ball grid array) type semiconductor device, which is an example of a resin-seal type semiconductor device, having a structure in which a rough surface for heat dissipation is formed on a top face of a package (a sealing resin layer). In this conventional BGA type semiconductor device, the rough shape is formed on the top face of the package (the sealing resin layer), and thus the amount of surface area of the package (the sealing resin layer) can be increased; accordingly, the amount of area of the surface of the package that is in contact with air can be increased. This makes it possible for heat generated therein to be dissipated more efficiently compared with the case where no rough shape for heat dissipation is formed.

However, in the conventional BGA type semiconductor device disclosed in the above mentioned JP-A-H11-26658, although heat dissipating characteristic is improved to some extent by forming the rough shape on the surface of the package (the sealing resin layer), in a case where a semiconductor chip that generates a larger amount of heat is mounted, it is difficult to sufficiently dissipate heat that is generated in the semiconductor chip, which is inconvenient. As a result, it is difficult to prevent a malfunction of and a decrease in lifetime of a semiconductor element, and this causes the semiconductor device to inconveniently deteriorate in reliability.

SUMMARY OF THE INVENTION

The present invention has been made in order to solve the problems described above, and an object of the present invention is to provide a resin-sealed semiconductor device that has an improved heat dissipating characteristic and is thereby prevented from deteriorating in reliability.

To achieve the above object, according to the present invention, a resin-sealed semiconductor device includes: a substrate on a predetermined area of which a semiconductor chip is mounted; a plurality of heat dissipating members that are formed to be arranged at predetermined intervals in an area of the substrate different from the area on which the semiconductor chip is mounted; and a sealing resin layer that covers the semiconductor chip and at least a part of the heat dissipating members.

In this resin-sealed semiconductor device according to the present invention, provision of the plurality of heat dissipating members that are formed to be arranged at predetermined intervals in the area of the substrate that is different from the area on which the semiconductor chip is mounted makes it easy for heat generated in the semiconductor chip to be dissipated outside. As a result, heat dissipating characteristic of the resin-sealed semiconductor device is improved, and thus, even in a case where a semiconductor chip that generates a larger amount of heat is mounted, heat generated in the semiconductor chip can be sufficiently dissipated. This helps prevent the semiconductor device from deteriorating in reliability.

In the above-described resin-sealed semiconductor device according to the present invention, it is preferable that at least one of the plurality of heat dissipating members be so formed that part thereof is exposed at a top face of the resin-seal type semiconductor device. With this structure, heat generated in the semiconductor chip can be easily dissipated outside via the exposed part of the heat dissipating members.

In this resin-sealed semiconductor device according to the present invention described above, it is preferable that the plurality of heat dissipating members be each formed of a metal cylinder and arranged to surround the semiconductor chip in plan view. With this structure, heat generated in the semiconductor chip can be dissipated outside more easily.

In the above-described structure in which a part of the heat dissipating members is exposed at the top face of the sealing resin layer, it is preferable that the resin-sealed semiconductor device further comprise a heat sink mounted on a top face of the resin sealing layer, and that the heat dissipating members be thermally connected to the heat sink. With this structure, heat generated in the semiconductor chip can be efficiently dissipated outside via the heat sink.

In the above-described structure in which a part of the heat dissipating members is exposed at the top face of the sealing resin layer, it is preferable that the substrate be a wiring substrate including a plurality of wiring layers each formed to have a predetermined wiring pattern, that the plurality of heat dissipating members be each formed of a conductive material, and that at least one of the plurality of heat dissipating members be electrically connected to a predetermined one of the wiring layers.

In the above-described resin-sealed semiconductor device according to the present invention, as a result of the semiconductor chip being sealed by the sealing resin layer, a BGA type package can be formed.

Thus, according to the present invention, as a result of heat dissipating characteristic being further improved, a resin-sealed semiconductor device that can be prevented from deteriorating in reliability can be easily achieved.

DETAILED DESCRIPTION OF PREFERRED EMBODIMENTS

Hereinafter, detailed descriptions will be given of embodiments embodying the present invention with reference to the drawings. The embodiments described below will deal with cases where the present invention is applied to a BGA type semiconductor device which is an example of resin-seal type semiconductor devices.

First Embodiment

Figure 1:
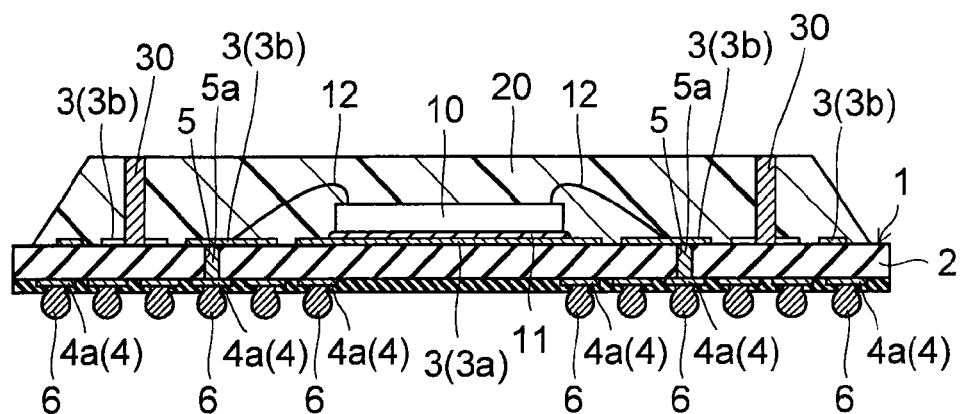
FIG. 1 is a sectional view showing a BGA type semiconductor device of a first embodiment of the present invention.
Figure 2:
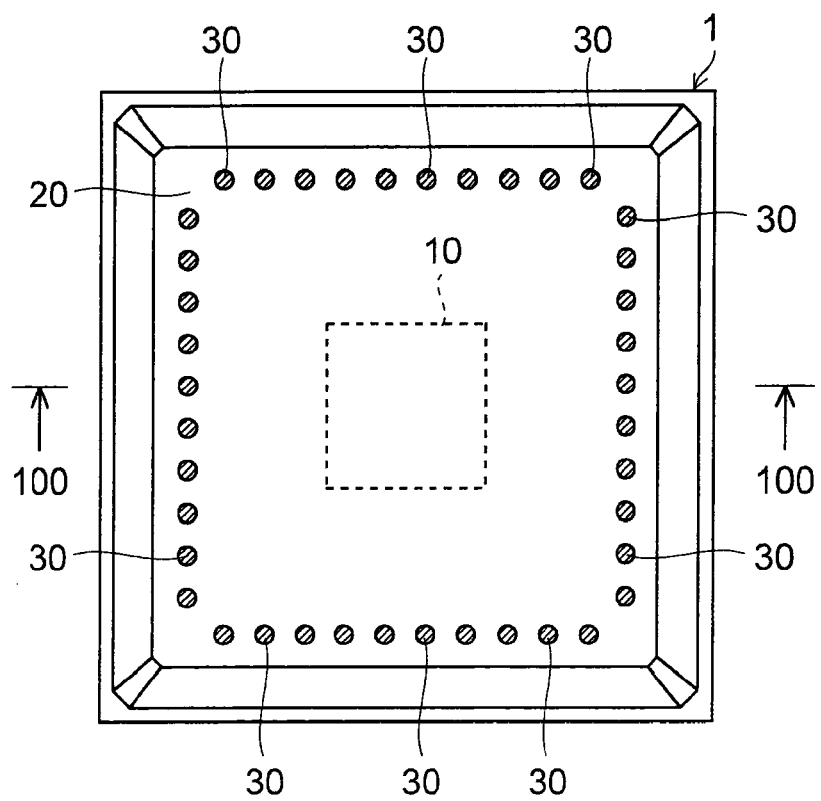
FIG. 2 is a plan view showing the BGA type semiconductor device of the first embodiment of the present invention.
Figure 3:
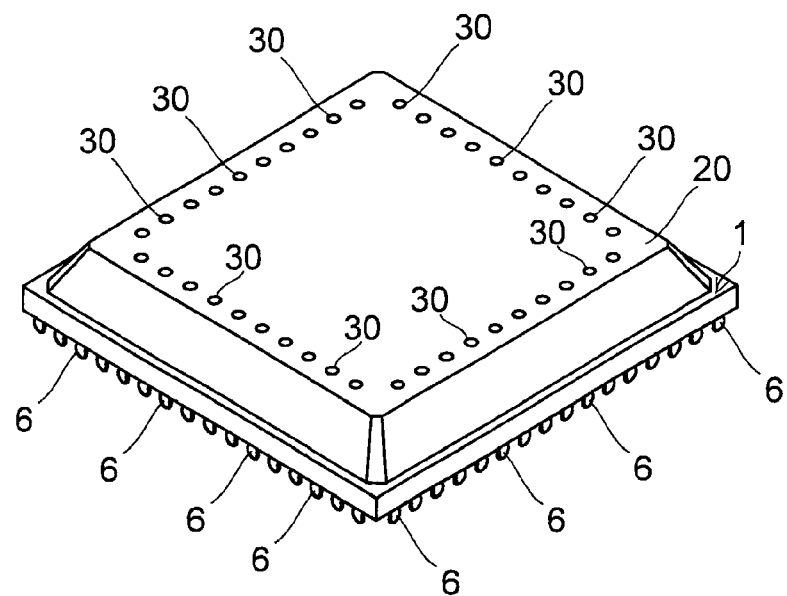
FIG. 3 is an overall perspective view showing the BGA type semiconductor device of the first embodiment of the present invention.

FIG. 1 is a sectional view showing a BGA type semiconductor device of a first embodiment of the present invention. FIG. 2 is a plan view showing the BGA type semiconductor device of the first embodiment of the present invention. FIG. 3 is an overall perspective view showing the BGA type semiconductor device of the first embodiment of the present invention. FIG. 1 is a sectional view taken along line 100-100 in FIG. 2. First, a description will be given of a structure of the BGA type semiconductor device of the first embodiment of the present invention, with reference to FIGS. 1 to 3.

The BGA type semiconductor device according to the first embodiment at least includes, as shown in FIG. 1, a wiring substrate 1, a semiconductor chip 10 that is mounted on the wiring substrate 1, and a sealing resin layer 20 that covers the semiconductor chip 10 at a top face of the wiring substrate 1. The wiring substrate 1 is an example of the "substrate" of the present invention.

The wiring substrate 1 is a double-sided substrate formed of a base material layer and a plurality of wiring layers 3 and a plurality of wiring layers 4 formed on a top face and a bottom face of the base material layer, respectively. The base material layer 2 of this wiring substrate 1 is formed of an insulating material such as a resin material, an organic polymer material, and a ceramics material. The wiring layers 3 and 4 of the wiring substrate 1 are formed of a conductive material such as copper. The plurality of wiring layers 3 formed on the top face of the base material layer 2 include a mounting section 3a on which the semiconductor chip 10 is mounted and connection electrode layers 3b; the plurality of wiring layers 4 formed on the bottom face of the base material layer 2 include connection electrode layers 4a. The wiring layers 3 and 4 of the wiring substrate 1 are each formed to have a predetermined pattern shape.

In the wiring substrate 1 (the base material layer 2), a plurality of through holes 5 are formed to penetrate therethrough from the top face to the bottom face thereof in the thickness direction thereof. In these through holes 5, for example, plugs 5a made of a material such as metal are embedded. Via the just mentioned through holes 5 (the plugs 5a), the connection electrode layers 3b on the top face side of the wiring substrate 1 and the connection electrode layers 4a on the bottom face side of the wiring substrate 1 are electrically connected to each other. Instead of embedding the plugs 5a in the through holes 5, a conductive layer may be formed on a side wall of each of the through holes 5. Or, the through holes 5 may be filled in after the conductive layer is formed on the side wall of each of the through holes 5.

The semiconductor chip 10 is structured, for example, such that an integrated circuit and the like (not shown) are formed on one principal face (the top face) of the semiconductor chip 10. This semiconductor chip 10 is fixed, via an adhesive layer 11 formed of solder or the like, on the mounting section 3a of the wiring substrate 1 such that one principal face of the semiconductor chip 10 (the face thereof on which the integrated circuit and the like are formed) is on an upper side (a side opposite to the wiring substrate 1). The semiconductor chip 10 is electrically connected to the connection electrode layers 3b on the top face side of the wiring substrate 1 via bonding wires 12 each made of, for example, a fine gold wire.

As shown in FIGS. 1 and 3, on the bottom face of the wiring substrate 1, a plurality of solder balls 6 are formed to function as external terminals. As shown in FIG. 1, these solder balls 6 are formed on the connection electrode layers 4a on the bottom face side of the wiring substrate 1. That is, the solder balls 6 are electrically connected to the semiconductor chip 10 via, for example, the through halls 5.

The sealing resin layer 20 is formed of, for example, a thermosetting resin such as epoxy resin, and is formed on the top face of the wiring substrate 1 so as to resin-seal components such as the semiconductor chip 10 and the bonding wires 12. This sealing resin layer 20 resin-seals the semiconductor chip 10, the bonding wires 12, and the like to protect them from gas and water.

Here, in the first embodiment, a plurality of metal bumps 30 made of copper are formed in a predetermined area (which is different from the area on which the semiconductor chip 10 is mounted) of the wiring substrate 1. As shown in FIGS. 1 and 2, the plurality of metal bumps 30 are arranged at predetermined intervals around the semiconductor chip 10. The metal bumps 30 are an example of the "heat dissipating members" and the "metal cylinders" of the present invention.

In the first embodiment, as shown in FIGS. 1 to 3, the plurality of metal bumps 30 are each covered by the above-described sealing resin layer 20 while a part thereof is exposed at the top face of the sealing resin layer 20. This structure can be obtained by, for example, sealing the metal bumps 30 with the sealing resin layer 20 and then grinding the top face of the sealing resin layer 20 to remove a predetermined amount thereof. Incidentally, in this case, the top face of the sealing resin layer 20 and the exposed part of the metal bumps 30 are flush with each other.

In the first embodiment, as described above, the provision of the plurality of metal bumps 30 arranged at predetermined intervals in the predetermined area of the wiring substrate 1 makes it easy for heat generated in the semiconductor chip 10 to be dissipated outside. As a result, heat dissipating characteristic of the BGA type semiconductor device can be improved, and thus, even in a case where a semiconductor chip that generates a large amount of heat is mounted, heat generated in the semiconductor chip can be sufficiently dissipated. This helps prevent the semiconductor device from deteriorating in reliability.

Also, in the first embodiment, the plurality of metal bumps 30 are each formed such that a part thereof is exposed at the top face of the sealing resin layer 20, and thus heat generated in the semiconductor chip 10 can be easily dissipated outside via the exposed part of each of the metal bumps 30.

Figure 4:
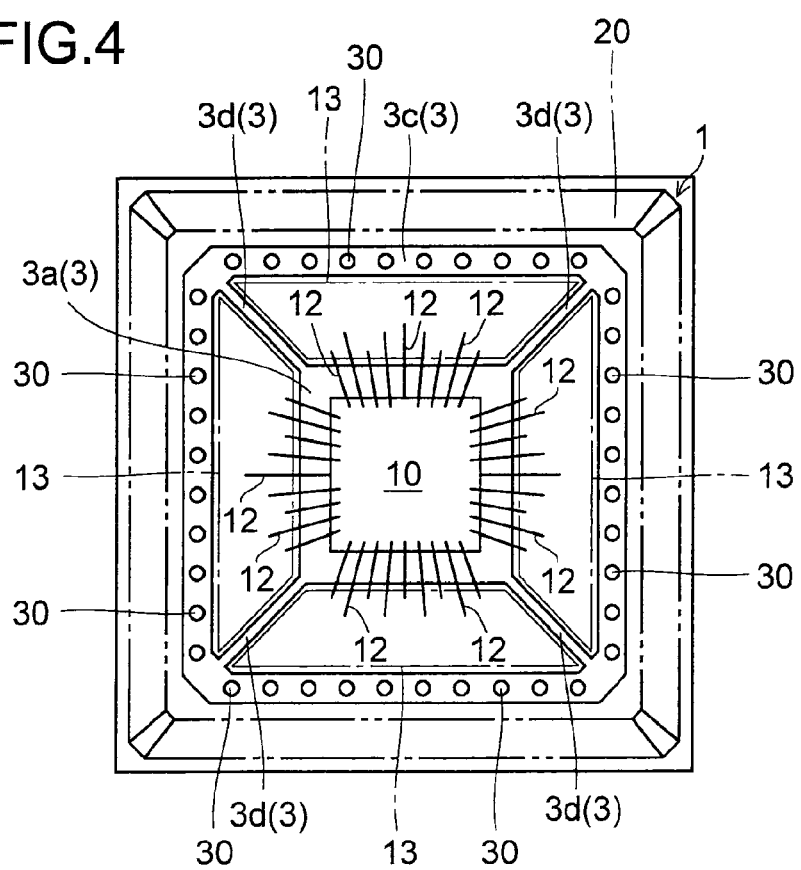
FIG. 4 is a plan view showing a modified example of the BGA type semiconductor device of the first embodiment of the present invention.

FIG. 4 is a plan view showing a modified example of the BGA type semiconductor device of the first embodiment of the present invention. As shown in FIGS. 1 and 4, in the modified example of the BGA type semiconductor device of the first embodiment, the plurality of wiring layers 3 formed on the top face of the base material layer 2 (see FIG. 1) further include a conductive layer 3c for heat dissipation and four connection sections 3d for thermally connecting this conductive layer 3c for heat dissipation to the mounting section 3a on which the semiconductor chip 10 is mounted.

The conductive layer 3c for heat dissipation is formed in an area in the vicinity of a periphery of the wiring substrate 1 to have a frame shape that surrounds the semiconductor chip 10 and the bonding wires 12 in plan view. The four connection sections 3d are arranged one at each of four corners of the mounting section 3a, and are formed to radiate outward in plan view. The conductive layer 3c for heat dissipation, the four connection sections 3d, and the mounting section 3a are connected to one another as one piece. The connection electrode layers 3b (see FIG. 1) that are electrically connected to the semiconductor chip 10 via the bonding wires 12 is formed in each of areas 13 that are surrounded by the mounting section 3a, the conductive layer 3c, and the connection sections 3d. Also, on the top face of the conductive layer 3c for heat dissipation, the metal bumps 30 described above are formed.

Incidentally, the modified example of the first embodiment is otherwise structured in the same manner as the first embodiment described above.

In the modified example of the first embodiment, as described above, not only the plurality of metal bumps 30 are formed on the conductive layer 3c for heat dissipation, but also the conductive layer 3c for heat dissipation and the mounting section 3a on which the semiconductor chip 10 is mounted are thermally connected to each other via the connection sections 3d, and as a result, heat generated in the semiconductor chip 10 can be easily transmitted to the metal bumps 30. Thus, heat generated in the semiconductor chip 10 can be easily dissipated outside via the plurality of metal bumps 30.

Incidentally, the modified example of the first embodiment also has all the advantages that the above-described first embodiment has.

Second Embodiment

Figure 5:
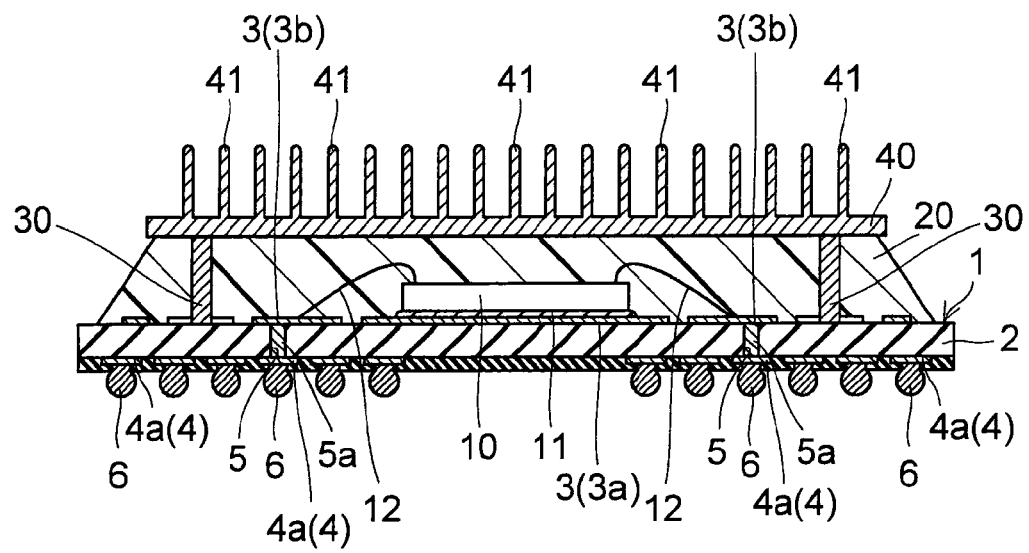
FIG. 5 is a sectional view showing a BGA type semiconductor device of a second embodiment of the present invention.

FIG. 5 is a sectional view showing a BGA type semiconductor device of a second embodiment of the present invention. As shown in FIG. 5, the BGA type semiconductor device of this second embodiment is the BGA type semiconductor device of the first embodiment described above further including a heat sink 40. This heat sink 40 is formed of a metal material such as aluminum that is highly thermally conductive, and it has a plurality of heat dissipating fins 41. The heat sink 40 is fixed to the top face of the sealing resin layer 20 such that it is thermally connected to each one of the plurality of metal bumps 30.

Incidentally, the second embodiment is otherwise structured in the same manner as the first embodiment described above.

In the second embodiment, as a result of the heat sink 40 that is thermally connected to the metal bumps 30 being provided on the top face of the sealing resin layer 20 as described above, heat generated in the semiconductor chip 10 can be effectively dissipated outside via this heat sink 40.

Incidentally, the second embodiment also has all the advantages that the above-described first embodiment has.

Third Embodiment

Figure 6:
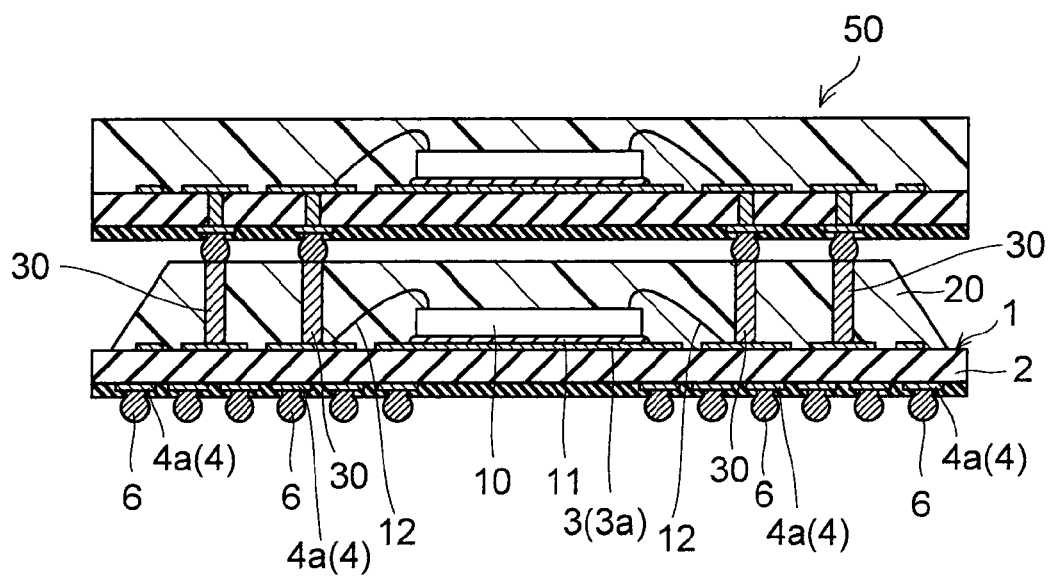
FIG. 6 is a sectional view showing a BGA type semiconductor device of a third embodiment of the present invention.

FIG. 6 is a sectional view showing a BGA type semiconductor device of a third embodiment of the present invention. As shown in FIG. 6, in this BGA type semiconductor device of the third embodiment, at least one of the plurality of metal bumps 30 is formed to be electrically connected to a predetermined one of the connection electrode layers 3b. This enables the at least one of the metal bumps 30 that is electrically connected to the predetermined one of the connection electrode layers 3b to function as an electric conductor.

With the BGA type semiconductor device of the third embodiment structured as described above, when another semiconductor device 50 is mounted on the BGA type semiconductor device to form a package-on-package (PoP) structure, the upper-side semiconductor device 50 can be electrically connected to the lower-side BGA type semiconductor device easily. And in a case where the semiconductor device 50 that is placed on the upper side is provided with heat dissipation measures, heat from the BGA type semiconductor device can be dissipated from the semiconductor device 50.

Incidentally, the third embodiment is otherwise structured in the same manner as the first embodiment described above, and also has all the advantages that the above-described first embodiment has.

Fourth Embodiment

Figure 7:
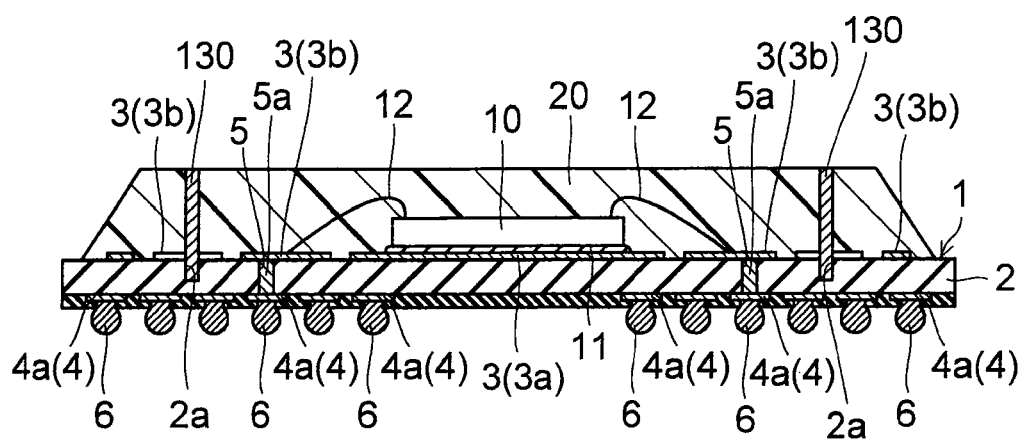
FIG. 7 is a sectional view showing a BGA type semiconductor device of a fourth embodiment of the present invention.

FIG. 7 is a sectional view showing a BGA type semiconductor device of a fourth embodiment of the present invention. As shown in FIGS. 1 and 7, in this BGA type semiconductor device of the fourth embodiment, unlike in the first to third embodiments described above, the wiring substrate 1 is provided with metal pins 130 (see FIG. 7) instead of the metal bumps 30 (see FIG. 1). The metal pins 130 are an example of the "heat dissipating member" and the "metal cylinder" of the present invention. These metal pins 130 are formed of copper that is highly thermally conductive, and are fixed to the wiring substrate 1 such that they extend in a thickness direction of the semiconductor chip 10. Specifically, in a predetermined area of the wiring substrate 1, a plurality of recesses 2a are formed to have a predetermined depth in a thickness direction of the wiring substrate 1 from the top face thereof; the above-described metal pins 130 are inserted one into each of the plurality of recesses 2a.

In the fourth embodiment, as a result of the plurality of metal pins 130 being provided on the wiring substrate 1 as described above, heat generated in the semiconductor chip 10 can be dissipated outside easily as in the first to the third embodiments described above.

Also, in the fourth embodiment, as a result of the plurality of metal pins 130 being provided on the wiring substrate 1, heat dissipating characteristic can be improved, and in addition, the semiconductor chip 10 can be prevented from warping.

The fourth embodiment is otherwise structured in the same manner as the first, the second, or the third embodiment described above. And the fourth embodiment also has all the advantages that the above-described first embodiment has.

Fifth Embodiment

Figure 8:
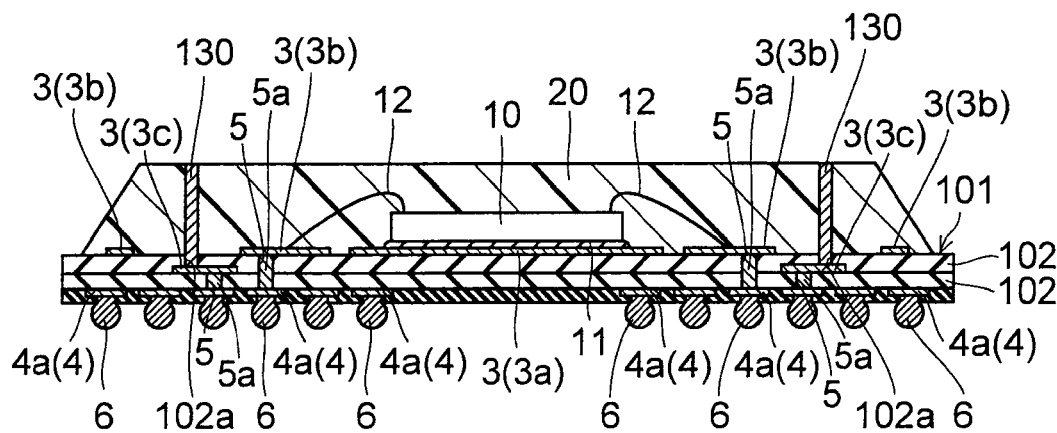
FIG. 8 is a sectional view showing a BGA type semiconductor device of a fifth embodiment of the present invention.

FIG. 8 is a sectional view showing a BGA type semiconductor device of a fifth embodiment of the present invention. A description will be given of a structure of the BGA semiconductor device of the fifth embodiment of the present invention with reference to FIG. 8.

Unlike the BGA type semiconductor devices of the first to the fourth embodiments described above, the BGA type semiconductor device of the fifth embodiment has a wiring substrate 101 formed of a multi-layer substrate. Specifically, the wiring substrate 101 is formed of a plurality of base material layers 102 laid on top of one another. On a top face and a bottom face of the base material layer 102, wiring layers 3 and wiring layers 4 are formed. This base material layer 102 is formed of, for example, an insulating material such as a resin material, an organic polymer material, and a ceramics material. The wiring layers 3 and 4 of the wiring substrate 101 (the base material layers 102) are each formed of a conductive material such as copper. Furthermore, the wiring layers 3 of the wiring substrate 101 (the base material layers 102) include a mounting section 3a that is formed on a top face of the wiring substrate 101 and on which a semiconductor chip 10 is mounted, connection electrode layers 3b that are also formed on the top face of the wiring substrate 101, and inner wiring layers 3c that are formed at an inner layer side. On the other hand, the wiring layers 4 of the wiring substrate 101 (the base material layers 102) include connection electrode layers 4a that are formed on the bottom face of the wiring substrate 101. Incidentally, the wiring substrate 101 is an example of the "substrate" of the present invention.

Also, in a predetermined part of the wiring substrate 101 (the base material layers 102), through holes (via holes) 5 are formed for electrically connecting the wiring layers at the upper-layer side to those at the lower-layer side. In each of these through holes (via holes) 5, for example, a plug 5a made of a material such as a metal material is embedded. Instead of embedding a plug 5a in each of the through holes (via holes) 5, a conductive layer may be formed on a side wall of each of the through holes 5. Or, the through holes 5 may be filled in after the conductive layer is formed on the side wall of each of the through holes 5.

Also, in the fifth embodiment, as in the fourth embodiment described above, the wiring substrate 101 is provided with a plurality of metal pins 130. The metal pins 130 are formed of copper that is highly thermally conductive, and is fixed to the wiring substrate 101 such that they extend in a thickness direction of the semiconductor chip 10. Specifically, in a predetermined area of the wiring substrate 101, a plurality of recesses 102a are formed to have a predetermined depth in a thickness direction of the wiring substrate 1 from the top face thereof, and the above-described metal pins 130 are inserted one into each of the plurality of recesses 102a.

Here, in the fifth embodiment, at least one of the plurality of recesses 102a is located in an area corresponding to any one of the inner wiring layers 3c. Also, these recesses 102a are formed deep enough to reach the inner wiring layers 3c. Thus, the at least one of the recesses 102a that is located in an area corresponding to any one of the inner wiring layers 3c allows the metal pin 130 that is inserted thereinto to be electrically connected to the inner wiring layer 3c of the wiring substrate 101. That is, at least one of the plurality of metal pins 130, the metal pins 130 each being inserted into a corresponding one of the plurality of recesses 102a, is electrically connected to a corresponding one of the inner wiring layers 3c of the wiring substrate 101.

In the BGA semiconductor device of the fifth embodiment having the above-described structure, as a result of at least one of the plurality of metal pins 130 being electrically connected to a corresponding one of the inner wiring layers 3c, the at least one of the metal pins 130 that is electrically connected to the corresponding inner wiring layer 3c can function as an electric conductor.

Incidentally, the fifth embodiment is otherwise structured in the same manner as the fourth embodiment described above. And the fifth embodiment also has all the advantages the above-described first to fourth embodiments have.

Incidentally, it should be understood that the embodiments disclosed in this application are presented only by way of example in all respects and do not limit the present invention in any manner. The scope of the present invention is determined from the appended claims rather than from the aforementioned detailed descriptions of preferred embodiments but by the appended claims, and further, it is intended by the appended claims to cover all modifications of the present invention which fall within the true spirit and scope of the invention and its equivalents.

For example, although the first to the fifth embodiments described above deal with the cases in which the present invention is applied to a BGA type semiconductor device exemplifying resin-seal type semiconductor devices, but this is not meant to limit the present invention in any manner, and the present invention may be applied to any other type of resin-seal type semiconductor device.

Also, although the first to the fifth embodiments described above deal with the cases in which a part of heat dissipating members (metal bumps or metal pins) is exposed at a top face of a resin sealing layer, but this is not meant to limit the present invention, and a structure may be adopted in which no part of the heat dissipating members is exposed out of the sealing-resin layer. Also, a structure may be adopted in which at least one of the plurality of heat dissipating members has a part thereof exposed at the top face of the sealing-resin layer.

Also, although the first to the fifth embodiments described above deal with the cases in which a plurality of heat dissipating members (metal bumps or metal pins) are arranged so as to surround semiconductor chip in plan view, but this is not meant to limit the present invention, and the plurality of heat dissipating members (the metal bumps or the metal pins) may be arranged in a manner different from those in the first to the fifth embodiments described above.

Incidentally, although the first to the fifth embodiments described above deal with the cases in which metal bumps or metal pins are used as an example of heat dissipating members, but this is not meant to limit the present invention, and heat dissipating members other than metal bumps and metal pins may be used. Also, heat dissipating members having any shape other than a metal cylinder shape may be used.

Also, although the first to the fourth embodiments described above deal with the cases in which a BGA type semiconductor device (resin-seal type semiconductor device) is formed of a wiring substrate that is a double-sided substrate, but this is not meant to limit the present invention in any manner, and the BGA type semiconductor device (resin-seal type semiconductor device) may be formed of a wiring substrate rather than a double-sided substrate such as a multilayer substrate.

Also, although the first to the third embodiments described above deal with the cases in which metal bumps are formed of copper (Cu), but this is not meant to limit the present invention, and the metal bumps may be formed of a metal material other than copper (Cu). For example, the metal bumps may be formed of aluminum (Al).

The modified example of the first embodiment described above deals with the case where a conductive layer for heat dissipation is formed in a frame shape and the conductive layer for heat dissipation and a mounting section are thermally connected to each other via four connection section that are formed to radiate outward from the mounting section, but this is not meant to limit the present invention, and the conductive layer for heat dissipation and the connection sections may be structured differently from those shown in the above-described structure (the structure shown in the modified example of the first embodiment described above).

The fourth and the fifth embodiments described above deal with the examples in which metal pins are formed of copper (Cu), but this is not meant to limit the present invention, and the metal pins may be formed of a metal material other than copper (Cu). For example, the metal pins may be formed of aluminum (Al).

What is claimed is:

1. A resin-sealed semiconductor device comprising:
a substrate having a base material layer formed of an insulating material and a plurality of wiring layers formed of an electrically conductive material, the substrate having a semiconductor chip mounted on a top face thereof;
a bonding wire;
an external connection electrode on a bottom face of the base material layer of the substrate, the external connection electrode having a solder ball provided thereon;
a plurality of metal cylinders, each of the metal cylinders having a bottom face thereof in contact with the substrate; and
a sealing resin layer that covers the semiconductor chip and the metal cylinders except a top face of each of the metal cylinders,
wherein
the wiring layers are formed at least on a top face and the bottom face of the base material layer,
the sealing resin layer is formed of a different material from the base material layer, and completely covers the wiring layers formed on the top face of the base material layer,
the wiring layers include a first wiring layer, a second wiring layer, a third wiring layer, and the external connection electrode,
the first wiring layer and the second wiring layer are formed on the top face of the base material layer,
the semiconductor chip is fixed on the first wiring layer via an adhesive layer, and is electrically connected to the second wiring layer via the bonding wire,
the second wiring layer is disposed outside the first wiring layer, and is apart from the third wiring layer,
the third wiring layer is disposed outside the second wiring layer, and is apart from the bonding wire,
the bottom face or a side face of each of the metal cylinders is connected to the third wiring layer,
the metal cylinders enclose the semiconductor chip at predetermined intervals along edges of the semiconductor chip such that the metal cylinders are arranged in a quadrangular shape,
the third wiring layer is formed so as to enclose the first wiring layer,
four connection sections connect the first wiring layer to the third wiring layer,
the four connection sections are provided, one at each of four corners of the first wiring layer,
the four connection sections radiate outward in plan view,
the first wiring layer, the four connection sections, and the third wiring layer are connected to one another as one piece.

2. A resin-sealed semiconductor device comprising:
a substrate having a base material layer formed of an insulating material and a plurality of wiring layers formed of an electrically conductive material, the substrate having a semiconductor chip mounted on a top face thereof;
a bonding wire;
an external connection electrode on a bottom face of the base material layer of the substrate, the external connection electrode having a solder ball provided thereon;
a plurality of metal cylinders, each of the metal cylinders having a bottom face thereof in contact with the substrate; and
a sealing resin layer that covers the top face of the substrate, the metal cylinders except a top face of each of the metal cylinders, and the semiconductor chip,
wherein
the wiring layers are formed at least on a top face and the bottom face of the base material layer,
the sealing resin layer is formed of a different material from the base material layer, and completely covers the wiring layers formed on the top face of the base material layer,
the wiring layers include a first wiring layer, a second wiring layer, a third wiring layer, and the external connection electrode,
the first wiring layer and the second wiring layer are formed on the top face of the base material layer,
the semiconductor chip is fixed on the first wiring layer via an adhesive layer, and is electrically connected to the second wiring layer via the bonding wire,
the second wiring layer is disposed outside the first wiring layer, and is apart from the third wiring layer,
the third wiring layer is disposed outside the second wiring layer, and is apart from the bonding wire,
the bottom face or a side face of each of the metal cylinders is connected to the third wiring layer,
the metal cylinders enclose the semiconductor chip at predetermined intervals along edges of the semiconductor chip such that the metal cylinders are arranged in a quadrangular shape,
the third wiring layer is formed so as to enclose the first wiring layer,
four connection sections connect the first wiring layer to the third wiring layer,
the four connection sections are provided, one at each of four corners of the first wiring layer,
the four connection sections radiates outward in plan view,
the first wiring layer, the four connection sections, and the third wiring layer are connected to one another as one piece.

3. The resin-sealed semiconductor device of claim 1 further comprising a heat sink mounted on the top face of the resin sealing layer, wherein the metal cylinders are thermally connected to the heat sink.

4. The resin-sealed semiconductor device of claim 1 wherein the second wiring layer is formed in an area surrounded by the first wiring layer, the third wiring layer, and the four connection sections.

5. The resin-sealed semiconductor device of claim 1 wherein the bottom face of each of the metal cylinders is connected to the third wiring layer.

6. The resin-sealed semiconductor device of claim 3 wherein the heat sink is formed of aluminum.

7. The resin-sealed semiconductor device of claim 1 wherein the metal cylinders are formed of copper or aluminum.

8. The resin-sealed semiconductor device of claim 1 wherein the metal cylinders are along sides of the substrate.

9. The resin-sealed semiconductor device of claim 2 further comprising a heat sink mounted on the top face of the resin sealing layer, wherein the metal cylinders are thermally connected to the heat sink.

10. The resin-sealed semiconductor device of claim 2 wherein the second wiring layer is formed in an area surrounded by the first wiring layer, the third wiring layer, and the four connection sections.

11. The resin-sealed semiconductor device of claim 2 wherein the bottom face of each of the metal cylinders is connected to the third wiring layer.

12. The resin-sealed semiconductor device of claim 9 wherein the heat sink is formed of aluminum.

13. The resin-sealed semiconductor device of claim 2 wherein the metal cylinders are formed of copper or aluminum.

14. The resin-sealed semiconductor device of claim 2 wherein the metal cylinders are along sides of the substrate.

15. The resin-sealed semiconductor device of claim 1 wherein the first wiring layer, the second wiring layer, and the third wiring layer are in contact with the base material layer.

16. The resin-sealed semiconductor device of claim 2 wherein the first wiring layer, the second wiring layer, and the third wiring layer are in contact with the base material layer.

17. The resin-sealed semiconductor device of claim 1 wherein the first wiring layer, the third wiring layer, and the external connection electrode are apart from the bonding wire.

18. The resin-sealed semiconductor device of claim 2 wherein the first wiring layer, the third wiring layer, and the external connection electrode are apart from the bonding wire.

19. The resin-sealed semiconductor device of claim 1 wherein the third wiring layer is formed on the top face of the base material layer.

20. The resin-sealed semiconductor device of claim 2 wherein the third wiring layer is formed on the top face of the base material layer.

21. The resin-sealed semiconductor device of claim 1 wherein the second wiring layer is disposed apart from the first wiring layer.

22. The resin-sealed semiconductor device of claim 2 wherein the second wiring layer is disposed apart from the first wiring layer.

* * * * *